(12) United States Patent
Uzu et al.

(10) Patent No.: US 11,996,491 B2
(45) Date of Patent: May 28, 2024

(54) SOLAR CELL MODULE

(71) Applicant: KANEKA CORPORATION, Osaka (JP)

(72) Inventors: Hisashi Uzu, Settsu (JP); Gensuke Koizumi, Settsu (JP)

(73) Assignee: KANEKA CORPORATION, Osaka (JP)

( * ) Notice: Subject to any disclaimer, the term of this patent is extended or adjusted under 35 U.S.C. 154(b) by 191 days.

(21) Appl. No.: 17/481,252

(22) Filed: Sep. 21, 2021

(65) Prior Publication Data

US 2022/0005965 A1    Jan. 6, 2022

Related U.S. Application Data

(63) Continuation of application No. PCT/JP2020/012359, filed on Mar. 19, 2020.

(30) Foreign Application Priority Data

Mar. 22, 2019   (JP) .................... 2019-054982

(51) Int. Cl.
*H01L 31/0725*    (2012.01)
*H01L 31/0224*    (2006.01)
(Continued)

(52) U.S. Cl.
CPC .. *H01L 31/0725* (2013.01); *H01L 31/022441* (2013.01); *H01L 31/0475* (2014.12); *H01L 31/0747* (2013.01); *H10K 30/80* (2023.02)

(58) Field of Classification Search
CPC ............ H01L 31/0725; H01L 31/0475; H01L 31/022441; H01L 31/0747; H01L 31/043; H10K 30/80; H10K 30/57
See application file for complete search history.

(56) References Cited

U.S. PATENT DOCUMENTS

2015/0249170 A1    9/2015 Snaith et al.

FOREIGN PATENT DOCUMENTS

| JP | H07-202233 A | 8/1995 |
| JP | 2001-168355 A | 6/2001 |

(Continued)

OTHER PUBLICATIONS

Warren et al "Maximizing tandem solar cell power extraction using a three-terminal design." Sustainable Energy & Fuels 2.6 (2018): 1141-1147. (Year: 2018).*

(Continued)

*Primary Examiner* — Andrew J Golden
(74) *Attorney, Agent, or Firm* — Studebaker & Brackett PC

(57) ABSTRACT

A solar cell module comprises cell groups each containing solar cells, and each solar cell includes photoelectric converters, N number of which being connected in series, and first, second and third terminals. When the first terminal on one end of a first cell group has a reference potential, the second terminal on the other end of the mth cell group is connected to the first terminal on one end of another cell group, and N number of the third terminals of the mth cell group are respectively connected to N number of the first terminals of an m+1th cell group. The difference in potential between the second terminal on the other end of the mth cell group and the first terminal on one end of the other cell group is 10% or less of the difference in potential between the second and first terminals of the mth cell group.

10 Claims, 11 Drawing Sheets

(51) Int. Cl.
*H01L 31/0475* (2014.01)
*H01L 31/0747* (2012.01)
*H10K 30/80* (2023.01)

(56) References Cited

FOREIGN PATENT DOCUMENTS

JP 3368825 B2 1/2003
WO 2014/045021 A1 3/2014

OTHER PUBLICATIONS

Djebbour et al "Bandgap engineered smart three-terminal solar cell: New perspectives towards very high efficiencies in the silicon world." Progress in Photovoltaics: Research and Applications 27.4 (Jan. 2019): 306-315. (Year: 2019).*
Gee, James M., "A Comparison of Different Module Configurations for Multi-Band-Gap Solar Cells", Solar Cells, vol. 24, 1988, pp. 147-155.
Schulte-Huxel, Henning et al., "String-Level Modeling of Two, Three, and Four Terminal Si-Based Tandem Modules", IEEE Journal of Photovoltaics, Jul. 26, 2018, vol. 8, No. 5, pp. 1370-1375.
Santbergen, Rudi et al., "Optimization of Three-Terminal Perovskite/Silicon Tandem Solar Cells", IEEE Journal of Photovoltaics, Jan. 10, 2019, vol. 9, No. 2, pp. 446-451.
International Search Report issued in PCT/JP2020/012359; mailed Jun. 16, 2020.

* cited by examiner

SOLAR CELL MODULE

CROSS-REFERENCE TO RELATED APPLICATIONS

This application claims benefit of priority to International Patent Application No. PCT/JP2020/012359, filed Mar. 19, 2020, and to Japanese Patent Application No. 2019-054982, filed Mar. 22, 2019, the entire contents of each are incorporated herein by reference.

BACKGROUND

Technical Field

The present disclosure relates to a solar cell module.

Background Art

A multi-junction (tandem) solar cell including two stacked photoelectric converters including photoelectric conversion layers with different band gaps is provided for the purpose of effectively utilizing light in a wide wavelength range for higher conversion efficiency, as described, for example, in Japanese Unexamined Patent Application, Publication No. 2001-168355 and PCT International Publication No. WO2014/045021.

Examples of such a multi-junction solar cell include a two-terminal type including top and bottom cells connected in series; and a four-terminal type including top and bottom cells from which electricity is extracted separately. A three-terminal, multi-junction solar cell is also proposed, which utilizes the advantage of the two- and four-terminal types and has a potential to provide further improved photoelectric conversion efficiency, as described, for example, in Japanese Patent No. 3368825).

Moreover, a document by James M. Gee, entitled "A COMPARISON OF DIFFERENT MODULE CONFIGURATIONS FOR MULTI-BAND-GAP SOLAR CELLS", Solar Cells, Volume 24, 1988, Pages 147-155 (Non-Patent Document), relates to a three-terminal, multi-junction solar cell, discloses a wiring connection method for use in forming a three-terminal, tandem solar cell module with a ratio of top cell voltage to bottom cell voltage of 2:1.

SUMMARY

The wiring connection method disclosed in the Non-Patent Document cited above is limited to that for forming a three-terminal tandem solar cell module with a ratio of top cell voltage to bottom cell voltage of 2:1.

Accordingly, the present disclosure provides a solar cell module that can be produced using various types of three-terminal tandem solar cells.

The present disclosure relates to a solar cell module including M cell groups each including N solar cells, with M being an integer of 2 or more, and N being an integer of 3 or more. Each of the solar cells is a three-terminal tandem solar cell including a first photoelectric converter; a second photoelectric converter; first and second cell terminals for the first photoelectric converter; and first and third cell terminals for the second photoelectric converter, with the N first photoelectric converters being connected in series in the cell group. When the first cell terminal at one end of the first photoelectric converters connected in series in a first one of the cell groups is at a reference potential, the second cell terminal at another end of the first photoelectric converters connected in series in an m-th one of the cell groups is connected to the first cell terminal at one end of the first photoelectric converters connected in series in another one of the cell groups, with m being an integer of 1 or more and M or less. Also, the N third cell terminals in the m-th cell group are respectively connected to the N first cell terminals in an m+1-th one of the cell groups, and the absolute value of a potential difference between the second cell terminal at the another end in the m-th cell group and the first cell terminal at the one end in the another cell group, the cell terminals being connected to each other, is equal to or less than 10% of the absolute value of a potential difference between the first cell terminal at the one end in the m-th cell group and the second cell terminal at the another end in the m-th cell group, when the second cell terminal at the another end in the m-th cell group and the first cell terminal at the one end in the another cell group remain not connected to each other.

The present disclosure relates to another solar cell module including M cell groups each including N solar cells, with M being an integer of 2 or more, and N being an integer of 3 or more. Each of the solar cells is a three-terminal tandem solar cell including a first photoelectric converter; a second photoelectric converter; first and second cell terminals for the first photoelectric converter; and second and third cell terminals for the second photoelectric converter, with the N first photoelectric converters being connected in series in the cell group. When the first cell terminal at one end of the first photoelectric converters connected in series in a first one of the cell groups is at a reference potential, the second cell terminal at another end of the first photoelectric converters connected in series in an m-th one of the cell groups is connected to the first cell terminal at one end of the first photoelectric converters connected in series in another one of the cell groups, with m being an integer of 1 or more and M or less. Also, the N third cell terminals in the m-th cell group are respectively connected to the N first cell terminals in an m+1-th one of the cell groups, and the absolute value of a potential difference between the second cell terminal at the another end in the m-th cell group and the first cell terminal at the one end in the another cell group, the cell terminals being connected to each other, is equal to or less than 10% of the absolute value of a potential difference between the first cell terminal at the one end in the m-th cell group and the second cell terminal at the another end in the m-th cell group, when the second cell terminal at the another end in the m-th cell group and the first cell terminal at the one end in the another cell group remain not connected to each other.

The present disclosure makes it possible to assemble various types of three-terminal tandem solar cells into a module.

DETAILED DESCRIPTION

Figure 1:
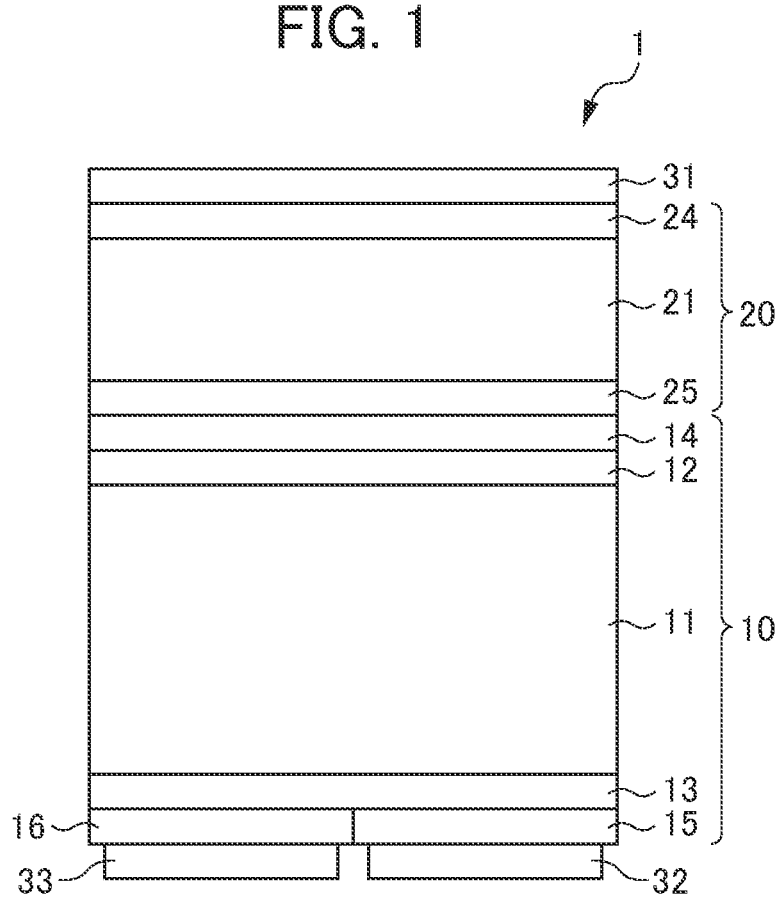
FIG. 1 is a cross-sectional view schematically showing a solar cell according to an embodiment of the present disclosure.

Hereinafter, embodiments of the present disclosure will be described with reference to the accompanying drawings. In the drawings, the same or corresponding components are denoted by the same reference sign. For the sake of convenience, hatching and reference signs for components may be omitted in some of the drawings, and in such cases, other drawings should be referred to.

Overview

A thin-film solar cell includes a photoelectric conversion layer for generating photocarriers, which includes a thin-film silicon semiconductor, such as amorphous silicon or microcrystalline silicon, a compound semiconductor, such as CIS or CIGS, an organic semiconductor, or the like. In recent years, many reports have been published concerning the improvement of the conversion efficiency of perovskite thin-film solar cells including organometallic perovskite crystals in a photoelectric conversion layer, and such solar cells have attracted attention as high conversion efficiency thin-film solar cells.

A multi-junction solar cell is known, which includes a photoelectric conversion unit including a thin-film photoelectric conversion layer; and another photoelectric conversion unit including another photoelectric conversion layer with a different band gap, in which the photoelectric conversion units are stacked and connected in series for the purpose of effectively utilizing light in a wide wavelength range for higher conversion efficiency. For example, Japanese Unexamined Patent Application, Publication No. 2001-168355 discloses a multi-junction thin film solar cell including: an amorphous photoelectric converter (top cell) including an amorphous silicon thin film as a photoelectric conversion layer; and a photoelectric converter (bottom cell) stacked on the amorphous photoelectric converter and including a microcrystalline silicon thin film as another photoelectric conversion layer. The microcrystalline silicon has a band gap narrower than that of the amorphous silicon and can absorb longer wavelength light. Thus, the stack of them allows light in a wide wavelength range to contribute to photoelectric conversion and thus can provide higher conversion efficiency for the solar cell.

PCT International Publication No. WO2014/045021 discloses a two-terminal tandem solar cell including: a bottom cell including a crystalline silicon substrate or the like; and a top cell in the form of a perovskite photoelectric conversion unit, which is stacked on the light-receiving side of the bottom cell. The perovskite photoelectric conversion layer has a higher spectral sensitivity to light with wavelengths shorter than 800 nm and produces a larger amount of photocurrent. On the other hand, the perovskite photoelectric conversion layer hardly absorbs light with wavelengths longer than 800 nm. Therefore, current matching will be possible between the top and bottom cells if the perovskite photoelectric converter and the large-current photoelectric converter including a semiconductor substrate such as a crystalline silicon substrate are connected in series as the top and bottom cells respectively.

Japanese Patent No. 3368825 discloses a three-terminal tandem solar cell having a structure including top and bottom cells for which the current can be freely set with no restrictions to the current matching mentioned above. The three-terminal tandem solar cell has one terminal on the light-receiving side of the top cell and two terminals on the bottom side of the bottom cell, and thus three extraction terminals are provided for the tandem solar cell. Moreover, with no restrictions to current matching, each photoelectric converter can have an optimized band gap, which is expected to provide further improved conversion efficiency. If the above perovskite solar cell is used in combination with the above crystalline silicon solar cell to form such a three-terminal tandem solar cell, the resulting solar cell can be expected to have high efficiency.

Figure 10A:
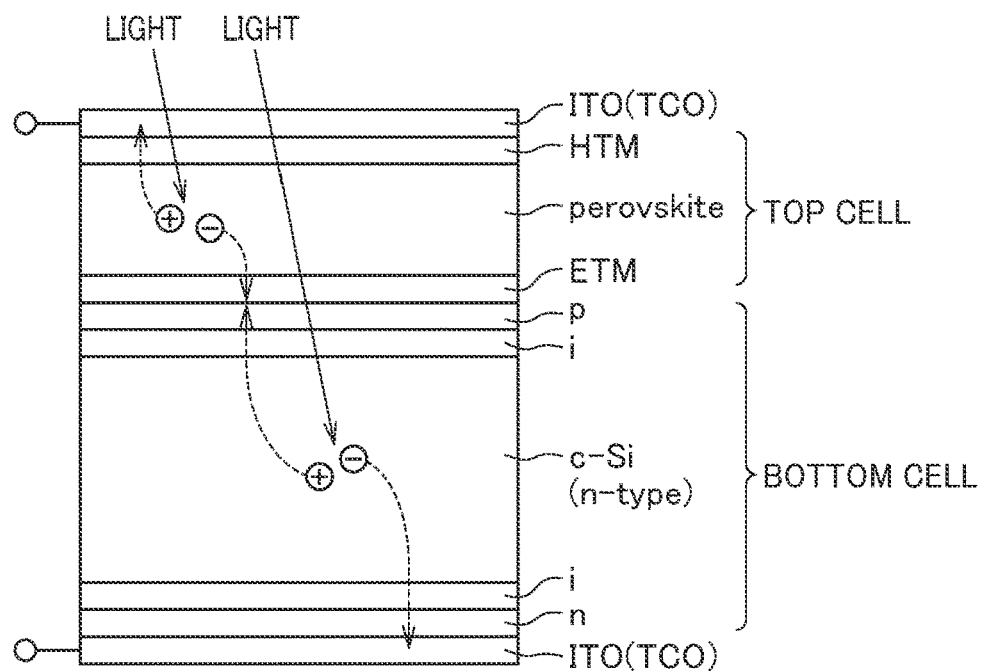
FIG. 10A is a schematic diagram showing a conventional two-terminal tandem solar cell.
Figure 10B:
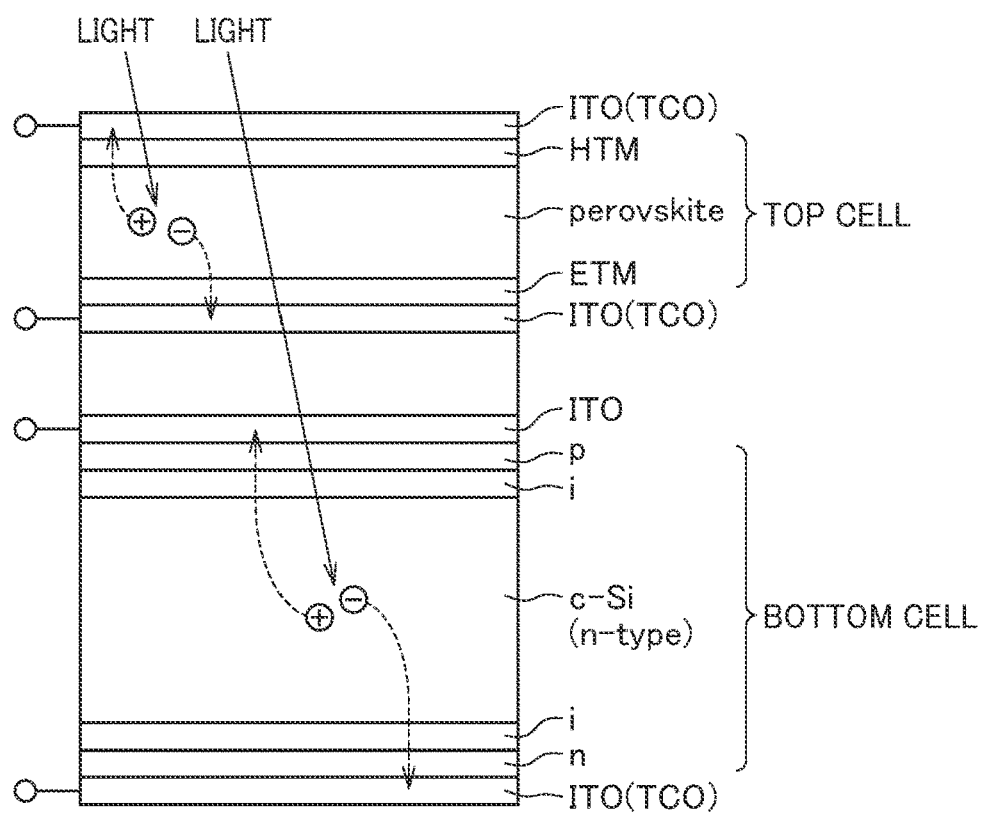
FIG. 10B is a schematic diagram showing a conventional four-terminal tandem solar cell.

FIGS. 10A and 10B show examples of conventional tandem solar cell structures. FIG. 10A is a schematic diagram showing a conventional two-terminal tandem solar cell, and FIG. 10B is a schematic diagram showing a conventional four-terminal tandem solar cell. The two-terminal tandem solar cell shown in FIG. 10A includes top and bottom cells connected in series. Therefore, either the top or bottom cell limits the output current to the smaller current. The four-terminal tandem solar cell shown in FIG. 10B includes top and bottom cells from which electricity is extracted separately. Therefore, electricity must be transported in the in-plane direction between the top and bottom cells, which results in a reduction in output power due to transparent conductive oxide (TCO)-induced absorption loss.

In view of these problems, a three-terminal tandem solar cell has been devised. In such a three-terminal tandem solar cell, the top and bottom currents may be any values, and current matching is unnecessary, so that the three-terminal tandem solar cell is expected to have an efficiency higher than that of the two-terminal tandem solar cell. Moreover, in the three-terminal tandem solar cell, electricity does not need to be transported in the in-plane direction between the top and bottom cells as in the four-terminal tandem solar cell, so that TCO-induced absorption loss can be reduced and the three-terminal tandem solar cell is expected to have an efficiency higher than that of the four-terminal tandem solar cell.

Also, the Non-Patent Document cited above, which relates to a three-terminal tandem solar cell, discloses a wiring connection method for use in forming a three-terminal, tandem solar cell module with a ratio of top cell voltage to bottom cell voltage of 2:1.

The wiring connection method disclosed in the Non-Patent Document is limited to that for three-terminal tandem solar cells with a ratio of top cell voltage to bottom cell voltage of 2:1, and thus has a problem in that the advantage of the three-terminal tandem solar cell "freely designable band gap" cannot be sufficiently utilized. Moreover, it also raises a problem in that the perovskite solar cell and the crystalline silicon solar cell, which have been expected to be combined in recent years, are difficult to combine as they are, because, in general, the perovskite solar cell providing high efficiency has a Voc of about 1.1 V while the crystalline silicon solar cell has a Voc of 0.7 V.

Accordingly, the present disclosure provides a solar cell module that can be produced using various types of three-terminal tandem solar cells.

Solar Cells

FIG. 1 is a cross-sectional view schematically showing a solar cell according to an embodiment of the present disclosure. The solar cell shown in FIG. 1 is a three-terminal tandem (multi-junction) solar cell including a first photoelectric converter (bottom cell) 10 and a second photoelectric converter (top cell) 20 stacked on the first photoelectric converter 10.

The second photoelectric converter 20 includes a photoelectric conversion layer 21 including a thin film of a second semiconductor layer. The second semiconductor layer absorbs light to generate photocarriers. The thin film of the second semiconductor layer may be a thin film of a silicon semiconductor, such as amorphous silicon or microcrystalline silicon, a thin film of a compound semiconductor, such as Cu—In—Se (CIS) or Cu—In—Ga—Se (CIGS), a thin film of an organic semiconductor, or a thin film of an organic-inorganic hybrid semiconductor.

The organic-inorganic hybrid semiconductor thin film may be a perovskite thin film including a photosensitive material with a perovskite crystal structure. The perovskite crystal material may be a compound represented by the general formula $R^1NH_3M^1X_3$ or $HC(NH_2)_2M^1X_3$. In the formula, $R^1$ is an alkyl group, preferably an alkyl group having 1 to 5 carbon atoms, and more preferably a methyl group. $M^1$ is a divalent metal ion and preferably Pb or Sn. X is a halogen, such as F, Cl, Br, or I. The three X's may be the same halogen or two or more halogens.

Preferred examples of the compound that forms the perovskite crystal material include compounds represented by the formula $CH_3NH_3Pb(I_{1-x}Br_x)_3$, wherein $0 \leq x \leq 1$. Perovskite materials with different types or contents of halogens can have various spectral sensitivity characteristics. The perovskite semiconductor thin film can be formed by various dry processes or film deposition from solution, such as spin coating.

When the photoelectric conversion layer 21 includes a perovskite semiconductor thin film, the second photoelectric converter 20 has charge transport layers 24 and 25. One of the charge transport layers 24 and 25 is a hole transport layer, and the other is an electron transport layer.

Examples of materials for the hole transport layer include polythiophene derivatives, such as poly-3-hexylthiophene (P3HT) and poly(3,4-ethylenedioxythiophene) (PEDOT), fluorene derivatives, such as 2,2',7,7'-tetrakis-(N,N-di-p-methoxyphenylamine)-9,9'-spirobifluorene (Spiro-OMeTAD), carbazole derivatives, such as polyvinylcarbazole, triphenylamine derivatives, diphenylamine derivatives, polysilane derivatives, and polyaniline derivatives. Examples of materials for the electron transport layer include metal oxides, such as titanium oxide, zinc oxide, niobium oxide, zirconium oxide, and aluminum oxide.

When the second photoelectric converter 20 is a silicon thin film photoelectric converter having a p-i-n junction, the second semiconductor layer in the photoelectric conversion layer 21 is an intrinsic (i-type) silicon thin film. The silicon thin film may include amorphous silicon, an amorphous silicon alloy, microcrystalline silicon, or a microcrystalline silicon alloy. Examples of the silicon alloy include silicon carbide, silicon oxide, silicon nitride, and silicon germanium. When the second photoelectric converter 20 has a p-i-n junction, it has conductive semiconductor layers 24 and 25 instead of the charge transport layers 24 and 25. One of the conductive semiconductor layers 24 and 25 is p-type, and the other is n-type.

The second semiconductor layer may be not only a thin film of a perovskite crystal material or a silicon material but also a thin film of any of various other semiconductors available to form photoelectric conversion layers. The charge transport layers or conductive semiconductor layers 24 and 25 adjacent to the second semiconductor layer may be selected, as needed, depending on the material of the photoelectric conversion layer.

The first photoelectric converter 10 includes a photoelectric conversion layer 11 including a first semiconductor layer. The first semiconductor layer absorbs light to generate photocarriers. The first semiconductor layer has a band gap different from that of the second semiconductor layer. Therefore, the first semiconductor layer has spectral sensitivity characteristics in a wavelength range different from that for the spectral sensitivity characteristics of the second semiconductor layer. Therefore, the multilayer photoelectric converter including a stack of the first photoelectric converter 10, which includes the first semiconductor layer as the photoelectric conversion layer 11, and the second photoelectric converter 20, which includes the second semiconductor layer as the photoelectric conversion layer 21, allows light in a wider wavelength range to contribute to photoelectric conversion. When the second semiconductor layer has a band gap wider than that of the first semiconductor layer, the second photoelectric converter 20 provides a light-receiving surface.

The first semiconductor layer as the photoelectric conversion layer 11 may be a semiconductor thin film or a semiconductor substrate. An example of the semiconductor thin film is an intrinsic (i-type) silicon thin film as mentioned above. Examples of the semiconductor substrate include crystalline semiconductor substrates including silicon substrates, such as single crystal silicon and polycrystalline silicon, germanium substrates, and gallium nitride substrates.

When the first semiconductor layer as the photoelectric conversion layer 11 is a single crystal silicon substrate, the first photoelectric converter 10 may be a diffusion type cell including a first conductivity-type single crystal silicon substrate and a second conductivity-type diffusion layer provided on the light-receiving side of the silicon substrate; or a hetero-junction cell including a first conductivity-type single crystal silicon substrate and a silicon thin film provided on each of the two surfaces of the silicon substrate.

When the first photoelectric converter 10 is a hetero-junction cell including: a single crystal silicon substrate as the first semiconductor layer in the photoelectric conversion layer 11; and a silicon thin film on each of the top and bottom sides of the single crystal silicon substrate, the first photoelectric converter 10 may have a conductive silicon thin film 14 provided on one main surface of the photoelectric conversion layer 11 adjacent to the second photoelectric converter 20; and conductive silicon thin films 15 and 16 provided on the other main surface of the photoelectric conversion layer 11 opposite to the one main surface (it is a so-called back contact-type photoelectric converter). The single crystal silicon substrate may be p-type or n-type. Since electron mobility is higher than hole mobility, particularly high conversion characteristics can be produced using the n-type single crystal silicon substrate.

Each of the conductive silicon thin films 14, 15, and 16 is a p- or n-type silicon thin film. The first photoelectric converter 10 is connected in series to the second photoelectric converter 20. The junction structure will be described in detail later.

An intrinsic silicon thin film 12 or 13 is preferably provided between the single crystal silicon substrate as the photoelectric conversion layer 11 and the conductive silicon thin film 14, 15, or 16. The intrinsic silicon thin film provided on the surface of the single crystal silicon substrate provides effective surface passivation while preventing impurity diffusion into the single crystal silicon substrate. When an intrinsic amorphous silicon thin film is provided as the intrinsic silicon thin film 12 or 13 on the surface of the single crystal silicon substrate, a high passivation effect can be produced for the surface of the single crystal silicon substrate.

An intermediate layer (not shown) may be provided between the first photoelectric converter 10 and the second photoelectric converter 20. An intermediate layer may be provided between the stacked two photoelectric converters for such purposes as adjustment of the band gap between the two stacked photoelectric converters, selective carrier transfer, tunnel junction formation, and selective wavelength reflection. The feature of the intermediate layer may be selected depending on the type, combination, or other features of the photoelectric converters 10 and 20. Such an intermediate layer may also be omitted when the conductive semiconductor layer (or charge transport layer) 14 or 25 is provided to also function as an intermediate layer at the interface between the first and second photoelectric converters 10 and 20.

To extract photo-produced carriers, an electrode 31 is provided on a main surface of the second photoelectric converter 20 opposite to the first photoelectric converter 10. To extract photo-produced carriers, electrodes 32 and 33 are provided respectively on the conductive semiconductor layers 15 and 16 on a main surface of the first photoelectric converter 10 opposite to the second photoelectric converter 20. Each of the electrodes 31, 32, and 33 may include a transparent electrode layer and a metal electrode layer or may include only a metal electrode layer. The transparent electrode layer is preferably made of a metal oxide, such as indium tin oxide (ITO), zinc oxide, or tin oxide. The metal electrode is preferably made of silver, copper, aluminum, or other metals. Hereinafter, the electrodes 32 and 33 are also referred to as the first cell terminal and the second cell terminal or the base terminal and the emitter terminal, respectively. The electrode 31 is also referred to as the third cell terminal or the front terminal.

Figure 2A:
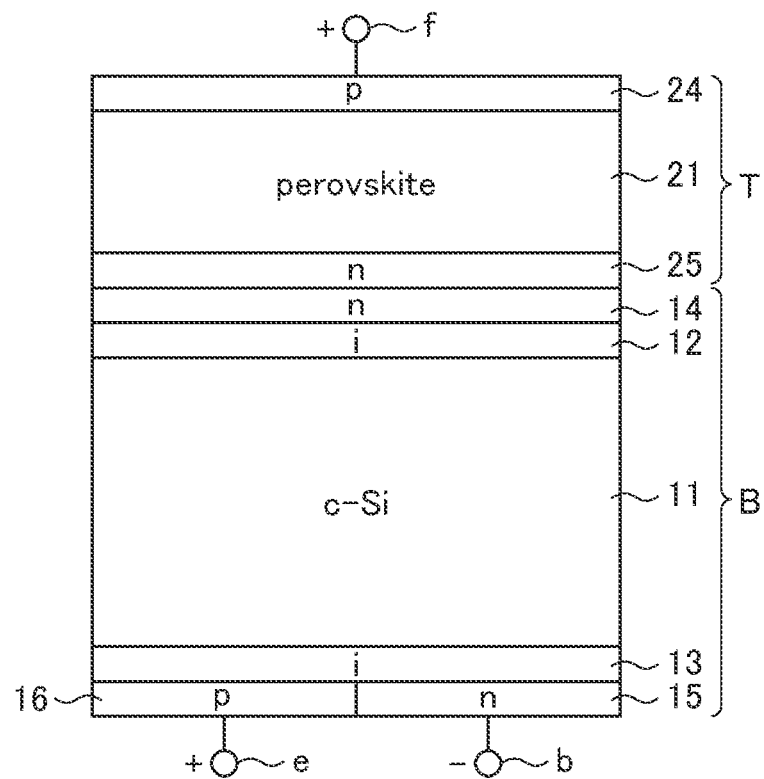
FIG. 2A is a cross-sectional view schematically showing a pn-np junction-type solar cell.
Figure 2B:
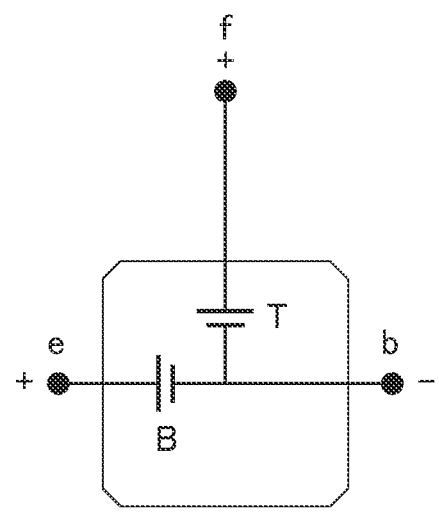
FIG. 2B is a schematic diagram showing the simplified equivalent circuit of the pn-np junction-type solar cell.
Figure 3A:
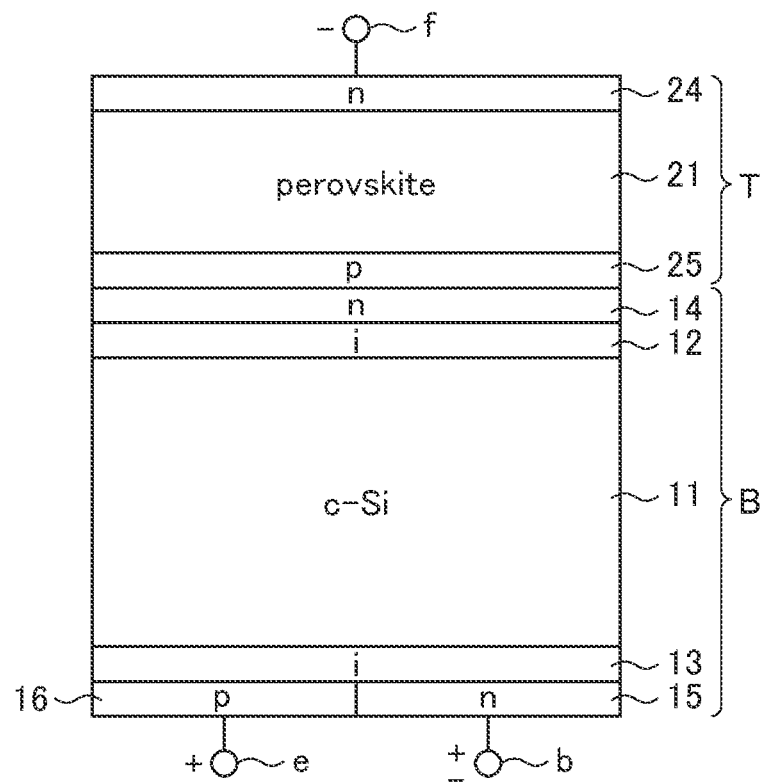
FIG. 3A is a cross-sectional view schematically showing an np-np junction-type solar cell.
Figure 3B:
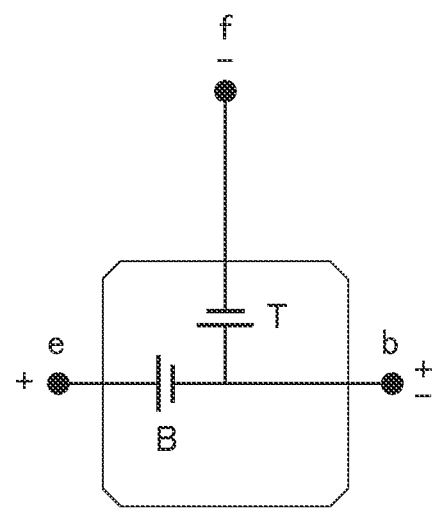
FIG. 3B is a schematic diagram showing the simplified equivalent circuit of the np-np junction-type solar cell.
Figure 4A:
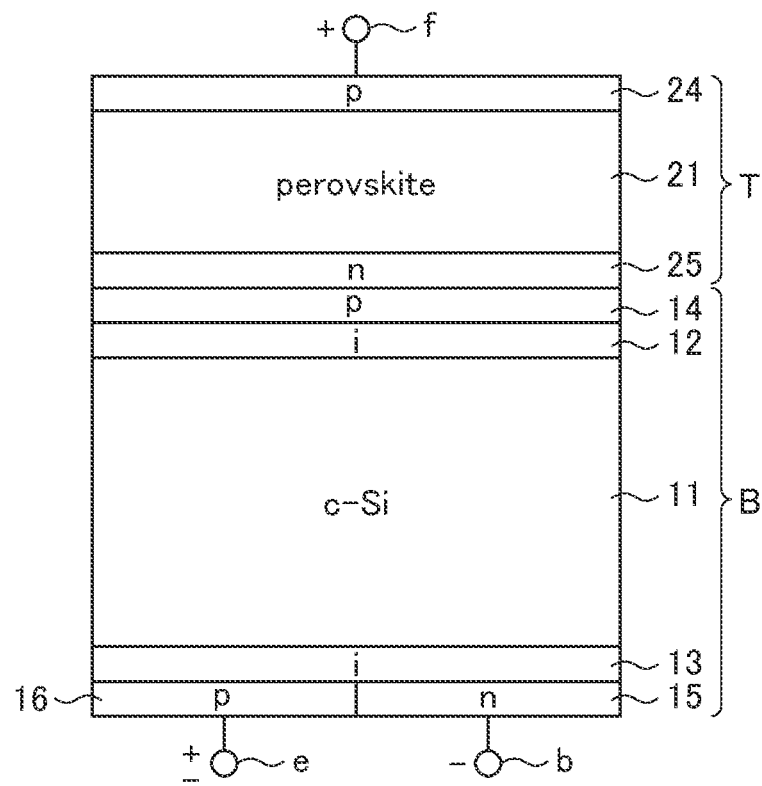
FIG. 4A is a cross-sectional view schematically showing a pn-pn junction-type solar cell.
Figure 4B:
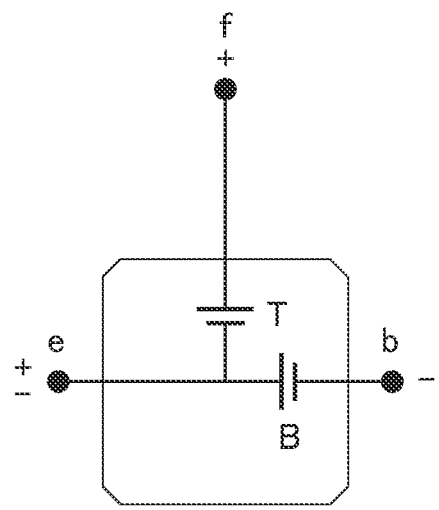
FIG. 4B is a schematic diagram showing the simplified equivalent circuit of the pn-pn junction-type solar cell.
Figure 5A:
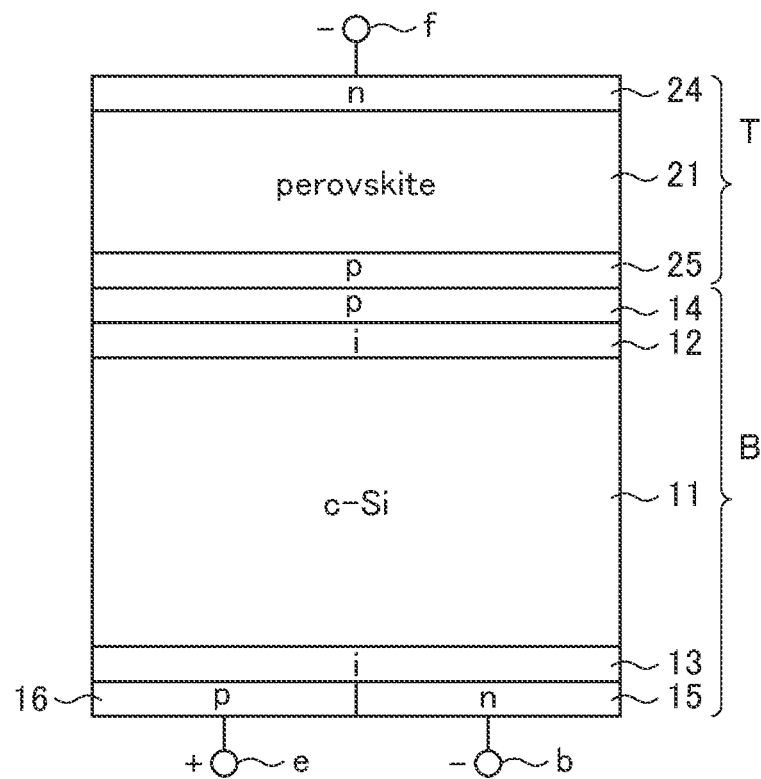
FIG. 5A is a cross-sectional view schematically showing an np-pn junction-type solar cell.
Figure 5B:
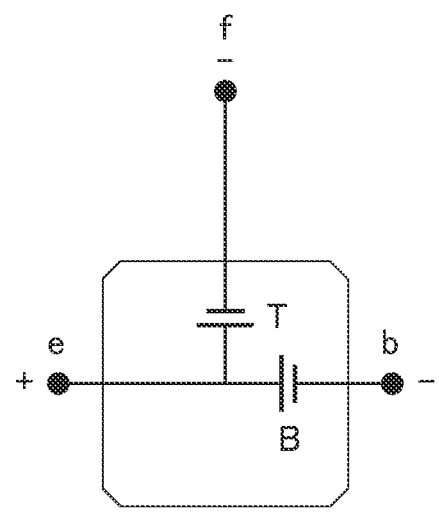
FIG. 5B is a schematic diagram showing the simplified equivalent circuit of the np-pn junction-type solar cell.
Figure 6A:
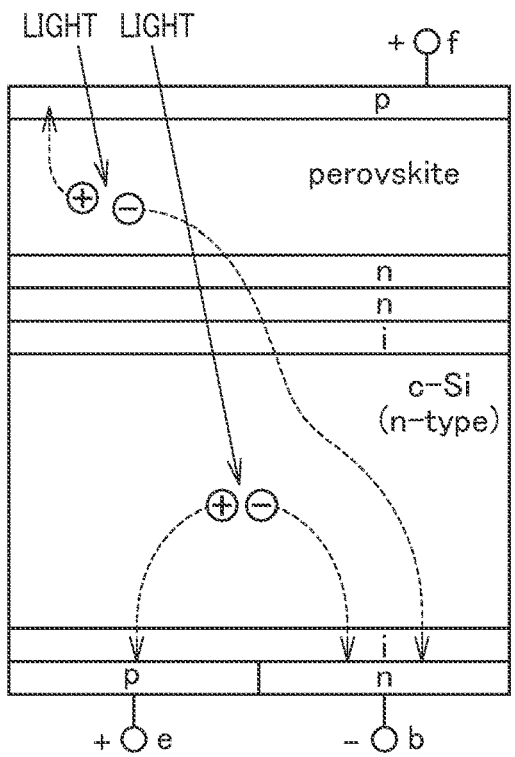
FIG. 6A is a schematic diagram showing how carriers move in the pn-np junction-type solar cell shown in FIG. 2A.
Figure 6B:
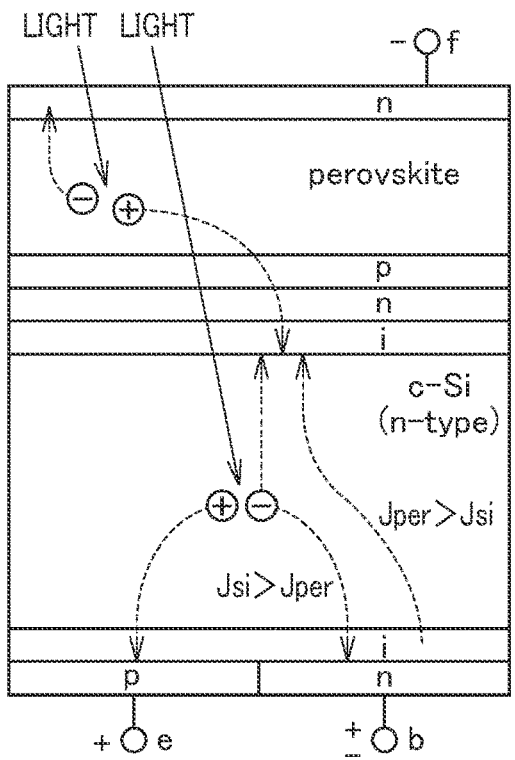
FIG. 6B is a schematic diagram showing how carriers move in the np-pn junction-type solar cell shown in FIG. 3A.

Hereinafter, a solar cell 1 including: a hetero-junction photoelectric converter as the first photoelectric converter 10, which is a back contact-type crystalline silicon photoelectric converter also having a conductive semiconductor layer on the light-receiving side; and a perovskite photoelectric converter as the second photoelectric converter 20 will be described by way of example. The solar cell with such a configuration may be any one of the four solar cells shown in FIGS. 2A and 2B to 5A and 5B depending on the combination of the junction structures of the first and second photoelectric converters 10 and 20. FIG. 2A is a cross-sectional view schematically showing a pn-np junction-type solar cell, and FIG. 2B is a schematic diagram showing the simplified equivalent circuit of the pn-np junction-type solar cell. FIG. 3A is a cross-sectional view schematically showing an np-np junction-type solar cell, and FIG. 3B is a schematic diagram showing the simplified equivalent circuit of the np-np junction-type solar cell. FIG. 4A is a cross-sectional view schematically showing a pn-pn junction-type solar cell, and FIG. 4B is a schematic diagram showing the simplified equivalent circuit of the pn-pn junction-type solar cell. FIG. 5A is a cross-sectional view schematically showing an np-pn junction-type solar cell, and FIG. 5B is a schematic diagram showing the simplified equivalent circuit of the np-pn junction-type solar cell. FIG. 6A is a schematic diagram showing how carriers move in the pn-np junction-type solar cell shown in FIG. 2A, and FIG. 6B is a schematic diagram showing how carriers move in the np-np junction-type solar cell shown in FIG. 3A.

In the FIGS. 2A and 2B to 6A and 6B, the electrodes 32, 33 and 31 mentioned above are shown as the base terminal (first or second cell terminal) b, the emitter terminal (second or first cell terminal) e, and the front terminal (third cell terminal) f, respectively. Moreover, the first photoelectric converter 10 and the second photoelectric converter 20 are represented by B (bottom cell) and T (top cell), respectively.

In the pn-np junction-type solar cell 1 shown in FIG. 2A, the second photoelectric converter T is a perovskite photoelectric converter, the charge transport layer 24 on the side opposite to the first photoelectric converter B is a hole transport layer, and the charge transport layer 25 on the first photoelectric converter B side is an electron transport layer. The first photoelectric converter B is a crystalline silicon photoelectric converter, the conductive silicon thin film 14 on the second photoelectric converter T side is an n-type silicon thin film, and the conductive silicon thin films 15 and 16 on the side opposite to the second photoelectric converter T are n-type and p-type silicon thin films, respectively. The photoelectric conversion layer 11 may be an n-type silicon substrate. In the pn-np junction-type solar cell 1 shown in FIGS. 2A and 2B, therefore, the second photoelectric converter T provides a p-n junction between the front terminal f and the base terminal b, and the first photoelectric converter B provides an n-p junction between the base terminal b and the emitter terminal e. As explained in detail later, the base terminal b and the emitter terminal e for the first photoelectric converter B can extract carriers without using the p-n junction of the second photoelectric converter T.

In the pn-np junction-type solar cell 1, as shown in FIG. 6A, carriers are generated in the second photoelectric converter T in response to the incident light, holes are collected by the front terminal f, and electrons are collected by the base terminal b through the first photoelectric converter B. In the first photoelectric converter B, carriers are also generated in response to the incident light, holes are collected by the emitter terminal e, and electrons are collected by the base terminal b. Thus, the pn-np junction-type solar cell 1 has two positive electrode terminals including the front terminal f and the emitter terminal e and has one negative electrode terminal including the base terminal b.

In the np-np junction-type solar cell 1 shown in FIG. 3A, the second photoelectric converter T is a perovskite photoelectric converter, the charge transport layer 24 on the side opposite to the first photoelectric converter B is an electron transport layer, and the charge transport layer 25 on the first photoelectric converter B side is a hole transport layer. The first photoelectric converter B is a crystalline silicon photoelectric converter, the conductive silicon thin film 14 on the second photoelectric converter T side is an n-type silicon thin film, and the conductive silicon thin films 15 and 16 on the side opposite to the second photoelectric converter T are n-type and p-type silicon thin films, respectively. The photoelectric conversion layer 11 may be an n- or p-type silicon substrate. In the np-np junction-type solar cell 1 shown in FIGS. 3A and 3B, therefore, the second photoelectric converter T provides an n-p junction between the front terminal f and the base terminal b, and the first photoelectric converter B provides an n-p junction between the base terminal b and the emitter terminal e. As explained in detail later, the base terminal b and the emitter terminal e for the first photoelectric converter B can extract carriers without using the n-p junction of the second photoelectric converter T.

In the np-np junction-type solar cell 1, as shown in FIG. 6B, carriers are generated in the second photoelectric converter T in response to the incident light, and, for example, when a circuit for external load is provided between the front terminal f and the base terminal b for the second photoelectric converter T, electrons are collected by the front terminal f, and holes flow toward the base terminal b through the first photoelectric converter B. Alternatively, when a circuit for external load is provided between the emitter terminal e and the base terminal b for the first photoelectric converter B, carriers are generated also in the first photoelectric converter B in response to the incident light, holes are collected by the emitter terminal e, and electrons flow toward the base terminal b. Hereinafter, a case will be discussed in which a circuit for external load is provided between the front terminal f and the base terminal b for the second photoelectric converter T and a circuit for external load is provided between the emitter terminal e and the base terminal b for the first photoelectric converter B. In this case, in the np-np junction-type solar cell 1, the front terminal f and the base terminal b serve as a negative electrode terminal and a positive electrode terminal respectively for the second photoelectric converter T circuit, while the base terminal b and the emitter terminal e serve as a negative electrode terminal and a positive electrode terminal respectively for the first photoelectric converter B circuit. Thus, the base terminal b serves as either a positive electrode terminal or a negative electrode terminal depending on the circuit. Moreover, as shown in FIG. 6B, the directions of current flow to the base terminal b are opposite between a case where the first photoelectric converter B has a current density Jsi higher than the current density Jper of the second photoelectric converter T (Jsi>Jper) and a case where the first photoelectric converter B has a current density Jsi lower than the current density Jper of the second photoelectric converter T (Jsi<Jper). Alternatively, with respect to the np-np junction-type solar cell 1, a circuit for external load may be provided between the front terminal f and the emitter terminal e for the second photoelectric converter T, and a circuit for external load may be provided between the emitter terminal e and the base terminal b for the first photoelectric converter B.

In the pn-pn junction-type solar cell 1 shown in FIG. 4A, the second photoelectric converter T is a perovskite photoelectric converter, the charge transport layer 24 on the side opposite to the first photoelectric converter B is a hole transport layer, and the charge transport layer 25 on the first photoelectric converter B side is an electron transport layer. The first photoelectric converter B is a crystalline silicon photoelectric converter, the conductive silicon thin film 14 on the second photoelectric converter T side is a p-type silicon thin film, and the conductive silicon thin films 15 and 16 on the side opposite to the second photoelectric converter T are n-type and p-type silicon thin films, respectively. The photoelectric conversion layer 11 may be an n- or p-type silicon substrate. In the pn-pn junction-type solar cell 1 shown in FIGS. 4A and 4B, therefore, the second photoelectric converter T provides a p-n junction between the front terminal f and the base terminal b, and the first photoelectric converter B provides a p-n junction between the emitter terminal e and the base terminal b. The emitter terminal e and the base terminal b for the first photoelectric converter B can also extract carriers without using the p-n junction of the second photoelectric converter T.

Similar to the np-np junction-type solar cell 1 shown in FIGS. 3A and 3B, with respect to the pn-pn junction-type solar cell 1, a circuit may be provided between the front terminal f and the base terminal b for the second photoelectric converter T, and a circuit may be provided between the emitter terminal e and the base terminal b for the first photoelectric converter B, and in such a case, the emitter terminal e serves as either a negative electrode terminal for the circuit for the first photoelectric converter B or a positive electrode terminal for the circuit for the second photoelectric converter T, and the directions of current flow to the emitter terminal e are opposite between a case where the first photoelectric converter B has a current density Jsi higher than the current density Jper of the second photoelectric converter T (Jsi>Jper) and a case where the first photoelectric converter B has a current density Jsi lower than the current density Jper of the second photoelectric converter T (Jsi<Jper). Alternatively, with respect to the pn-pn junction-type solar cell 1, a circuit for external load may be provided between the front terminal f and the emitter terminal e for the second photoelectric converter T, and a circuit for external load may be provided between the emitter terminal e and the base terminal b for the first photoelectric converter B.

In the np-pn junction-type solar cell 1 shown in FIG. 5A, the second photoelectric converter T is a perovskite photoelectric converter, the charge transport layer 24 on the side opposite to the first photoelectric converter B is an electron transport layer, and the charge transport layer 25 on the first photoelectric converter B side is a hole transport layer. The first photoelectric converter B is a crystalline silicon photoelectric converter, the conductive silicon thin film 14 on the second photoelectric converter T side is a p-type silicon thin film, and the conductive silicon thin films 15 and 16 on the side opposite to the second photoelectric converter T are n-type and p-type silicon thin films, respectively. The photoelectric conversion layer 11 may be a p-type silicon substrate. In the np-pn junction-type solar cell 1 shown in FIGS. 5A and 5B, therefore, the second photoelectric converter T provides an n-p junction between the front terminal f and the emitter terminal e, and the first photoelectric converter B provides a p-n junction between the emitter terminal e and the base terminal b. The emitter terminal e and the base terminal b for the first photoelectric converter B can also extract carriers without using the n-p junction of the second photoelectric converter T.

Like the pn-np junction-type solar cell 1 shown in FIGS. 2A and 2B, the np-pn junction-type solar cell 1 has one positive electrode terminal including the emitter terminal e and two negative electrode terminals including the front terminal f and the base terminal b.

Solar Cell Module

Figure 7:
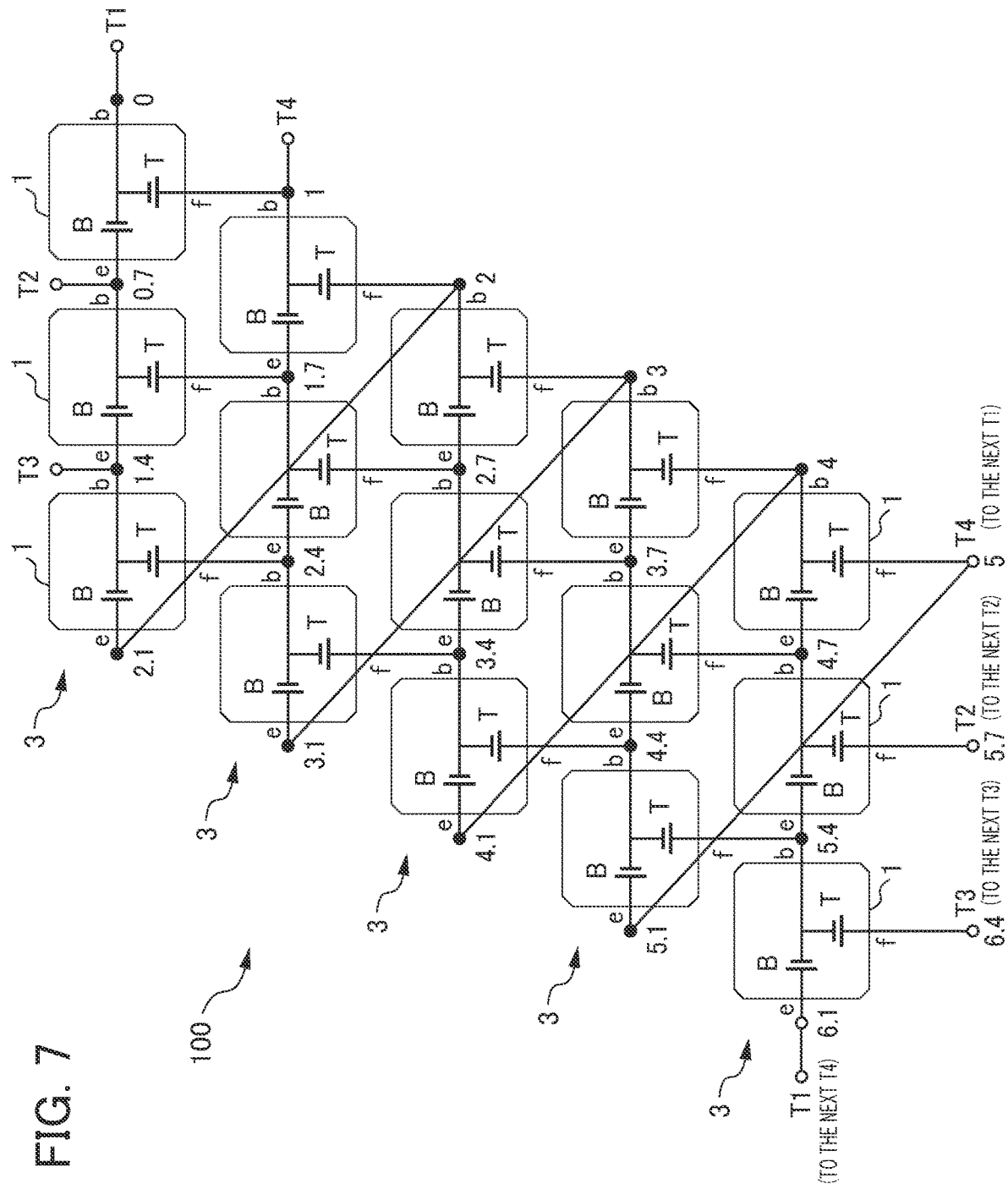
FIG. 7 is an equivalent circuit diagram schematically showing a solar cell module including solar cells according to an embodiment of the present disclosure.

Next, a solar cell module according to an embodiment of the present disclosure will be described with the aid of the simplified equivalent circuit of the solar cell 1 shown in FIG. 2B. FIG. 7 is an equivalent circuit diagram showing a solar cell module including solar cells according to an embodiment of the present disclosure. The solar cell module 100 shown in FIG. 7 includes five cell groups 3 each including three pn-np junction-type solar cells 1 (M=5, N=3). The solar cell module 100 has four pairs of module terminals T1, T2, T3, and T4 as current extraction electrodes, which corresponds to (N−1+VCM13/V13) pairs when expressed using VCM13 and V13 described later. In FIG. 7, the numerical values indicate potentials with respect to the reference potential (0 V).

As mentioned above, the solar cell 1 is a three-terminal tandem solar cell including the first photoelectric converter (bottom cell) B and the second photoelectric converter (top cell) T and having the base terminal (first cell terminal) b and the emitter terminal (second cell terminal) e, which are for the first photoelectric converter B, and the base terminal (first cell terminal) b and the front terminal (third cell terminal) f, which are for the second photoelectric converter 20.

The three first photoelectric converters B in each cell group 3 are connected in series. The base terminal b at one end (right end) of the first photoelectric converters B connected in series in the first (uppermost) cell group 3 is connected to one of the pair of module terminals T1 and is at a reference potential (0 V).

The emitter terminal e at the other end (left end) of the first photoelectric converters B connected in series in the m-th cell group 3, wherein m is any integer of 1 to 5 (specifically, m is an integer of 1 to M−VCM13/V13 when expressed using VCM13 and V13 described later), is connected to the base terminal b at one end of the first photoelectric converters B connected in series in the cell group 3 other than the m-th cell group 3. When m is larger than 3 (namely larger than M−VCM13/V13), there is no other cell group 3 to be connected to the m-th cell group 3. In this case, the emitter terminal e at the other end of the first photoelectric converters B connected in series in the m-th cell group 3 is not connected to another cell group 3 but connected to one of the module terminals T1, T2, T3, and T4.

Specifically, the emitter terminal e at the other end in the first cell group 3 is connected to the base terminal b at one end in the third cell group 3, and the emitter terminal e at the other end in the third cell group 3 is connected to the base terminal b at one end in the fifth cell group 3. The emitter terminal e at the other end in the fifth cell group 3 is connected to the other of the pair of module terminals T1.

The base terminal b at one end in the second cell group 3 is connected to one of the pair of module terminals T4, and the emitter terminal e at the other end in the second cell group 3 is connected to the base terminal b at one end in the fourth cell group 3. The emitter terminal e at the other end in the fourth cell group 3 is connected to the other of the pair of module terminals T4.

The three front terminals f in the m-th cell group 3 are respectively connected to the three base terminals b in the m+1-th cell group 3. When m is 5 (M), there is no m+1-th cell group 3 to be connected to the m-th cell group 3. In this case, the three front terminals f in the m-th cell group 3 are not connected to another cell group but connected to any of the module terminals T1, T2, T3, and T4.

Specifically, the three base terminals b in the first cell group 3 are respectively connected to one of the pair of module terminals T1, one of the pair of module terminals T2, and one of the pair of module terminals T3. The three front terminals fin the first cell group 3 are respectively connected to the three base terminals b in the second cell group 3, and the three front terminals f in the second cell group 3 are respectively connected to the three base terminals b in the third cell group 3. The three front terminals f in the third cell group 3 are respectively connected to the three base terminals b in the fourth cell group 3, and the three front terminals f in the fourth cell group 3 are respectively connected to the three base terminals b in the fifth cell group 3. The three front terminals f in the fifth cell group 3 are respectively connected to the other of the pair of module terminals T4, the other of the pair of module terminals T2, and the other of the pair of module terminals T3.

The potential difference (absolute value) between the emitter terminal e at the other end in the m-th cell group 3 and the base terminal b at one end in the cell group 3 other than the m-th cell group 3, there terminals being connected to each other, is equal to or less than 10% of the potential difference (absolute value) between the emitter terminal e at the other end in the m-th cell group 3 and the base terminal b at one end in the m-th cell group 3 (namely, the potential difference between the two ends of the cell group 3 including the N first photoelectric converters B connected in series) when the emitter terminal e at the other end in the m-th cell group 3 and the base terminal b at one end in the cell group 3 other than the m-th cell group 3 remain not connected to each other. In this way, there may be some potential difference between the terminals to be connected to each other. In this context, the potential refers to the value obtained when the individual first and second photoelectric converters B and T are virtually arranged while the emitter terminal e at the other end in the m-th cell group 3 remains not connected to the base terminal b at one end in the cell group 3 other than the m-th cell group 3. In this case, the potential at each terminal may be the open voltage (Voc) or the maximum operating voltage (Vpmax).

Specifically, the difference (absolute value) between the potential 2.1 V at the emitter terminal e at the other end in the first cell group 3 and the potential 2.0 V at the base terminal b at one end in the third cell group 3 is equal to or less than 10% of the difference (absolute value) 2.1 V between the potential 2.1 V at the emitter terminal e at the other end in the first cell group 3 and the potential 0 V (reference potential) at the base terminal b at one end in the first cell group 3. The difference (absolute value) between the potential 4.1 V at the emitter terminal e at the other end in the third cell group 3 and the potential 4.0 V at the base terminal b at one end in the fifth cell group 3 is equal to or less than 10% of the difference 2.1 V (absolute value) between the potential 4.1 V at the emitter terminal e at the other end in the third cell group 3 and the potential 2.0 V at the base terminal b at one end in the third cell group 3.

The difference (absolute value) between the potential 3.1 V at the emitter terminal e at the other end in the second cell group 3 and the potential 3.0 V at the base terminal b at one end in the fourth cell group 3 is equal to or less than 10% of the difference (absolute value) 2.1 V between the potential 3.1 V at the emitter terminal e at the other end in the second cell group 3 and the potential 1.0 V at the base terminal b at one end in the second cell group 3. The different (absolute value) between the potential 5.1 V at the emitter terminal e at the other end in the fourth cell group 3 and the potential 5.0 V at the other of the pair of module terminals T4 is equal to or less than 10% of the difference (absolute value) 2.1 V between the potential 5.1 V at the emitter terminal e at the other end in the fourth cell group 3 and the potential 3.0 V at the base terminal b at one end in the fourth cell group 3.

There is a difference between the current densities of the first and second photoelectric converters B and T. There is also a difference between the voltage of the first photoelectric converter B, namely, the potential difference V12 (=0.7 V) between the base terminal b and the emitter terminal e, and the voltage of the second photoelectric converter T, namely, the potential difference V13 (=1.0 V) between the base terminal b and the front terminal f.

When a multiple of the potential difference V12 (=0.7 V) is represented by VCM12 (=2.1 V) and a multiple of the potential difference V13 (=1.0 V) is represented by VCM13 (=2.0 V), the number of the first photoelectric converters B connected in series in the cell group 3 is VCM12/V12 (=3). The emitter terminal e at the other end in the m-th cell group 3 is connected to the base terminal b at one end in the VCM13/V13-th (=2-th) cell group from the m-th cell group 3, namely, in the m+VCM13/V13-th (=m+2-th) cell group 3. In this case, as shown above, there may be some potential difference between the terminals to be connected to each other. Thus, the absolute value of the difference between VCM12 and VCM13 only has to be equal to or less than 10% of the absolute value of VCM12.

In other words, when the least common multiple between the potential difference V12 (=0.7 V) and the potential difference V13 (=1.0 V) is represented by VMC (=2.0 V to 2.1 V), the number of the first photoelectric converters B connected in series in the cell group 3 is VCM/V12 (=about 3). Moreover, the emitter terminal e at the other end in the m-th cell group 3 is connected to the base terminal b at one end in the VCM/V13-th (=about 2-th) group from the m-th cell group 3, namely, in the m+VCM/V13-th (=about m+2-th) cell group 3. It should be noted that the potential difference VCM is not limited to the least common multiple between the potential difference V12 and the potential difference V13 and may be any other common multiple. In this regard, as shown above, there may be some potential difference between the terminals to be connected to each other. Thus, the common multiple between the potential difference V12 and the potential difference V13 may be a multiple of the potential difference V13 or a multiple of the potential difference V12 when the multiple of the potential difference V13 falls within the range of the multiple of the potential difference V12±5%. In this embodiment, therefore, the least common multiple between the potential differences V12 (=0.7 V) and V13 (=1.0 V) may be used as VCM (=2.0 V to 2.1 V).

In this way, the wires to be connected can be organized so that the number of extraction terminals in the module can be reduced. The power obtained across the pair of module terminals T1 corresponds to the power generated by the first photoelectric converters B connected in series in the first, third, and fifth cell groups. The power obtained across the pair of module terminals T4 corresponds to the power generated by the first photoelectric converters B connected in series in the second and fourth cell groups. The power obtained across the pair of module terminals T1 and T4 corresponds to the power generated by the second photoelectric converters T located first from one end (right end) in the cell groups and connected in series. The power obtained across the pair of module terminals T2 corresponds to the power generated by the second photoelectric converters T located second from one end in the cell groups and connected in series. The power obtained across the pair of module terminals T3 corresponds to the power generated by the second photoelectric converters T located third from one end in the cell groups and connected in series.

As described above, the solar cell module 100 according to this embodiment includes three-terminal tandem solar cells and thus provides high efficiency (high conversion efficiency) as compared to a solar cell module including two-terminal or four-terminal tandem solar cells. Moreover, the solar cell module 100 according to this embodiment allows wiring independently from the open voltage Voc of the two photoelectric converters in the tandem solar cell, which means a high degree of freedom of wiring or the solar cells to be used. Therefore, various types of three-terminal tandem solar cells can be assembled into a module.

Figure 11:
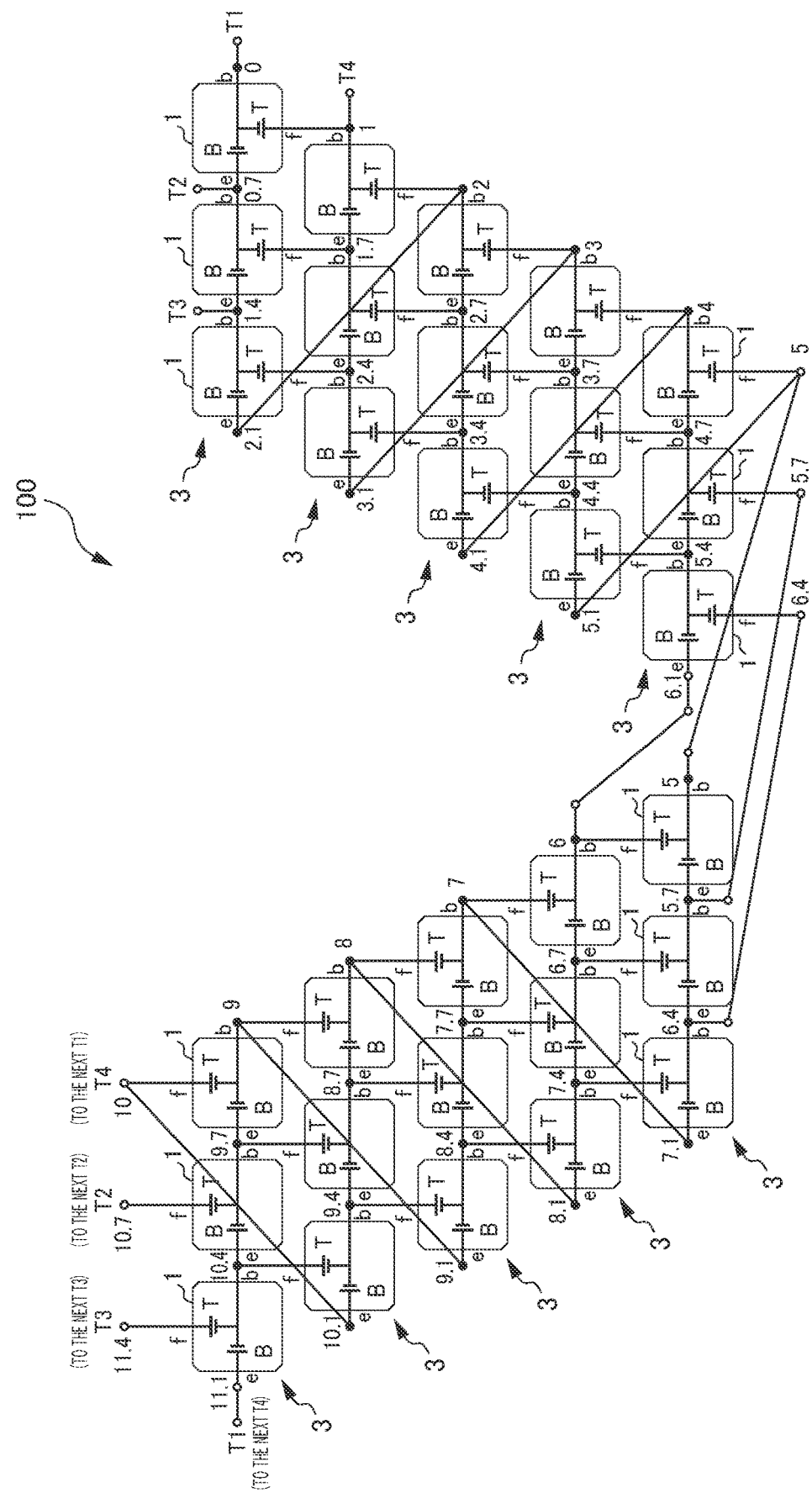
FIG. 11 is a diagram schematically showing, by means of equivalent circuits, an example of the layout of a solar cell module including solar cells according to an embodiment of the present disclosure.

This embodiment shows a solar cell module including M cell groups each including N solar cells, namely, a solar cell module having a circuit configuration in which the number of cells in the right-left direction is N and the number of cells in the up-down direction is M. It will be understood, however, that the solar cell module may have any configuration in which the number of cells in the right-left direction is not limited to N and may be any number and the number of cells in the up-down direction is not limited to M and may be any number. For example, as shown in FIG. 11, a solar cell module including ten (M) cell groups each including three (N) solar cells may be provided, having a layout in which six (2N) cells are arranged in the right-left direction and five (M/2) cells are arranged in the up-down direction. In this case, wiring connection will be easy if the circuits are connected so as to return in the up-down direction. It should be noted that FIG. 11 is a diagram which schematically shows an example of the layout of a solar cell module using equivalent circuit diagrams and does not correctly show the layout of the solar cell module. For example, solar cell modules have a general layout in which multiple solar cells are two-dimensionally and regularly arranged.

Modification 1

Figure 8:
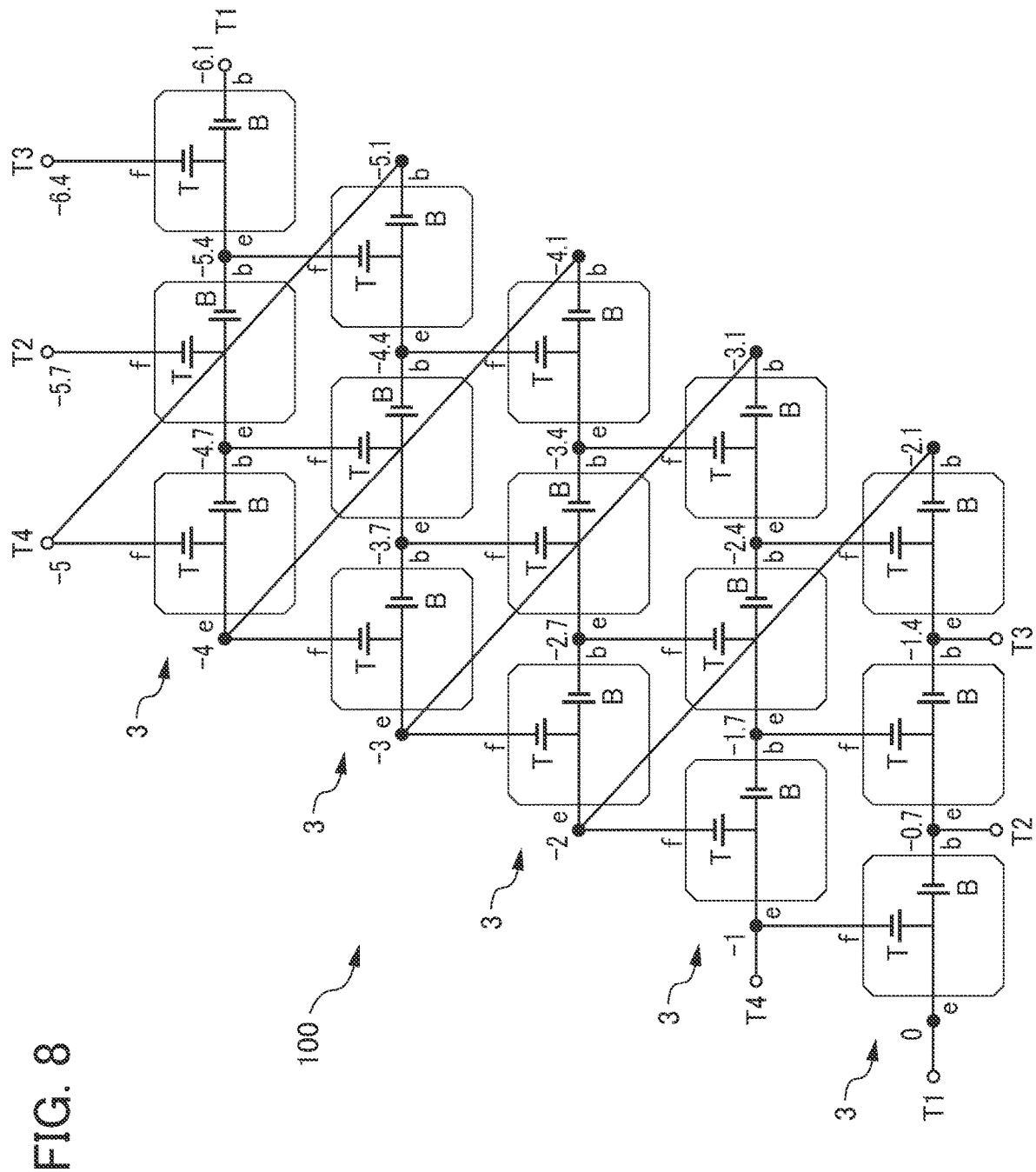
FIG. 8 is an equivalent circuit diagram schematically showing a solar cell module including solar cells according to a modification of the embodiment.

Next, a solar cell module according to Modification 1 of the embodiment will be described with the aid of the simplified equivalent circuit of the solar cell 1 shown in FIG. 5B. FIG. 8 is an equivalent circuit diagram showing a solar cell module including solar cells according to Modification 1 of the embodiment. The solar cell module 100 shown in FIG. 8 includes five cell groups 3 each including three np-pn junction-type solar cells 1 (M=5, N=3). The solar cell module 100 has four pairs of module terminals T1, T2, T3, and T4 as current extraction electrodes (corresponding to (N−1+VCM13/V13) pairs). In FIG. 8, the numerical values indicate potentials with respect to the reference potential (0 V).

The solar cell 1 is a three-terminal tandem solar cell including the first photoelectric converter (bottom cell) B and the second photoelectric converter (top cell) T and having the emitter terminal (first cell terminal) e and the base terminal (second cell terminal) b, which are for the first photoelectric converter B, and the emitter terminal (first cell terminal) e and the front terminal (third cell terminal) f, which are for the second photoelectric converter 20.

The three first photoelectric converters B in each cell group 3 are connected in series. The emitter terminal e at one end (left end) of the first photoelectric converters B connected in series in the first (lowermost) cell group 3 is connected to one of the pair of module terminals T1 and is at a reference potential (0 V).

The base terminal b at the other end (right end) of the first photoelectric converters B connected in series in the m-th cell group 3, wherein m is any integer of 1 to 5 (specifically, m is an integer of 1 to M−VCM13/V13), is connected to the emitter terminal e at one end of the first photoelectric converters B connected in series in the cell group 3 other than the m-th cell group 3. When m is larger than 3 (namely larger than M−VCM13/V13), there is no other cell group 3 to be connected to the m-th cell group 3. In this case, the base terminal b at the other end of the first photoelectric converters B connected in series in the m-th cell group 3 is not connected to another cell group 3 but connected to one of the module terminals T1, T2, T3, and T4.

Specifically, the base terminal b at the other end in the first cell group 3 is connected to the emitter terminal e at one end in the third cell group 3, and the base terminal b at the other end in the third cell group 3 is connected to the emitter terminal e at one end in the fifth cell group 3. The base terminal b at the other end in the fifth cell group 3 is connected to the other of the pair of module terminals T1.

The emitter terminal e at one end in the second cell group 3 is connected to one of the pair of module terminals T4, and the base terminal b at the other end in the second cell group 3 is connected to the emitter terminal e at one end in the fourth cell group 3. The base terminal b at the other end in the fourth cell group 3 is connected to the other of the pair of module terminals T4.

The three front terminals f in the m-th cell group 3 are respectively connected to the three emitter terminals e in the m+1-th cell group 3. When m is 5 (M), there is no m+1-th cell group 3 to be connected to the m-th cell group 3. In this case, the three front terminals f in the m-th cell group 3 are not connected to another cell group but connected to any of the module terminals T1, T2, T3, and T4.

Specifically, the three emitter terminals e in the first cell group 3 are respectively connected to one of the pair of module terminals T1, one of the pair of module terminals T2, and one of the pair of module terminals T3. The three front terminals f in the first cell group 3 are respectively connected to the three emitter terminals e in the second cell group 3, and the three front terminals f in the second cell group 3 are respectively connected to the three emitter terminals e in the third cell group 3. The three front terminals f in the third cell group 3 are respectively connected to the three emitter terminals e in the fourth cell group 3, and the three front terminals f in the fourth cell group 3 are respectively connected to the three emitter terminals e in the fifth cell group 3. The three front terminals f in the fifth cell group 3 are respectively connected to the other of the pair of module terminals T4, the other of the pair of module terminals T2, and the other of the pair of module terminals T3.

The potential difference (absolute value) between the base terminal b at the other end in the m-th cell group 3 and the emitter terminal e at one end in the cell group 3 other than the m-th cell group 3, there terminals being connected to each other, is equal to or less than 10% of the potential difference (absolute value) between the base terminal b at the other end in the m-th cell group 3 and the emitter terminal e at one end in the m-th cell group 3 (namely, the potential difference between the two ends of the cell group 3 including the N first photoelectric converters B connected in series) when the base terminal b at the other end in the m-th cell group 3 and the emitter terminal e at one end in the cell group 3 other than the m-th cell group 3 remain not connected to each other. In this way, there may be some potential difference between the terminals to be connected to each other.

Specifically, the difference (absolute value) between the potential −2.1 V at the base terminal b at the other end in the first cell group 3 and the potential −2.0 V at the emitter terminal e at one end in the third cell group 3 is equal to or less than 10% of the difference (absolute value) 2.1 V between the potential −2.1 V at the base terminal b at the other end in the first cell group 3 and the potential 0 V (reference potential) at the emitter terminal e at one end in the first cell group 3. The difference (absolute value) between the potential −4.1 V at the base terminal b at the other end in the third cell group 3 and the potential −4.0 V at the emitter terminal e at one end in the fifth cell group 3 is equal to or less than 10% of the difference 2.1 V (absolute value) between the potential −4.1 V at the base terminal b at the other end in the third cell group 3 and the potential −2.0 V at the emitter terminal e at one end in the third cell group 3.

The difference (absolute value) between the potential −3.1 V at the base terminal b at the other end in the second cell group 3 and the potential −3.0 V at the emitter terminal e at one end in the fourth cell group 3 is equal to or less than 10% of the difference (absolute value) 2.1 V between the potential −3.1 V at the base terminal b at the other end in the second cell group 3 and the potential −1.0 V at the emitter terminal e at one end in the second cell group 3. The different (absolute value) between the potential −5.1 V at the base terminal b at the other end in the fourth cell group 3 and the potential −5.0 V at the other of the pair of module terminals T4 is equal to or less than 10% of the difference (absolute value) 2.1 V between the potential −5.1 V at the base terminal b at the other end in the fourth cell group 3 and the potential −3.0 V at the emitter terminal e at one end in the fourth cell group 3.

There is a difference between the current densities of the first and second photoelectric converters B and T. There is also a difference between the voltage of the first photoelectric converter B, namely, the potential difference V12 (=−0.7 V) between the emitter terminal e and the base terminal b, and the voltage of the second photoelectric converter T, namely, the potential difference V13 (=−1.0 V) between the base terminal b and the front terminal f.

When a multiple of the potential difference V12 (=0.7 V) is represented by VCM12 (=2.1 V) and a multiple of the potential difference V13 (=1.0 V) is represented by VCM13 (=2.0 V), the number of the first photoelectric converters B connected in series in the cell group 3 is VCM12/V12 (=3). The base terminal b at the other end in the m-th cell group 3 is connected to the emitter terminal e at one end in the VCM13/V13-th (=2-th) cell group from the m-th cell group 3, namely, in the m+VCM13/V13-th (=m+2-th) cell group 3. In this case, as shown above, there may be some potential difference between the terminals to be connected to each other. Thus, the absolute value of the difference between VCM12 and VCM13 only has to be equal to or less than 10% of the absolute value of VCM12.

In other words, when the least common multiple between the potential difference V12 (=−0.7 V) and the potential difference V13 (=−1.0 V) is represented by VMC (=−2.0 V to −2.1 V), the number of the first photoelectric converters B connected in series in the cell group 3 is VCM/V12 (=about 3). Moreover, the base terminal b at the other end in the m-th cell group 3 is connected to the emitter terminal e at one end in the VCM/V13-th (=about 2-th) group from the m-th cell group 3, namely, in the m+VCM/V13-th (=about m+2-th) cell group 3. It should be noted that the potential difference VCM is not limited to the least common multiple between the potential difference V12 and the potential difference V13 and may be any other common multiple. In this regard, as mentioned above, the common multiple between the potential difference V12 and the potential difference V13 may be a multiple of the potential difference V13 or a multiple of the potential difference V12 when the multiple of the potential difference V13 falls within the range of the multiple of the potential difference V12±5%. In this embodiment, therefore, the least common multiple between the potential differences V12 (=0.7 V) and V13 (=1.0 V) may also be used as VCM (=2.0 V to 2.1 V).

The solar cell module 100 according to Modification 1 also has the same advantages as those of the solar cell module 100 shown in FIG. 7 described above.

In Modification 1, the solar cell module may have any configuration in which the number of cells in the right-left direction is not limited to N and may be any number and the number of cells in the up-down direction is not limited to M and may be any number. For example, similar to that shown in FIG. 11, a solar cell module including ten (M) cell groups each including three (N) solar cells may be provided, having a layout in which six (2N) cells are arranged in the right-left direction and five (M/2) cells are arranged in the up-down direction. In this case, wiring connection will be easy if the circuits are connected so as to return in the up-down direction.

Modification 2

Figure 9:
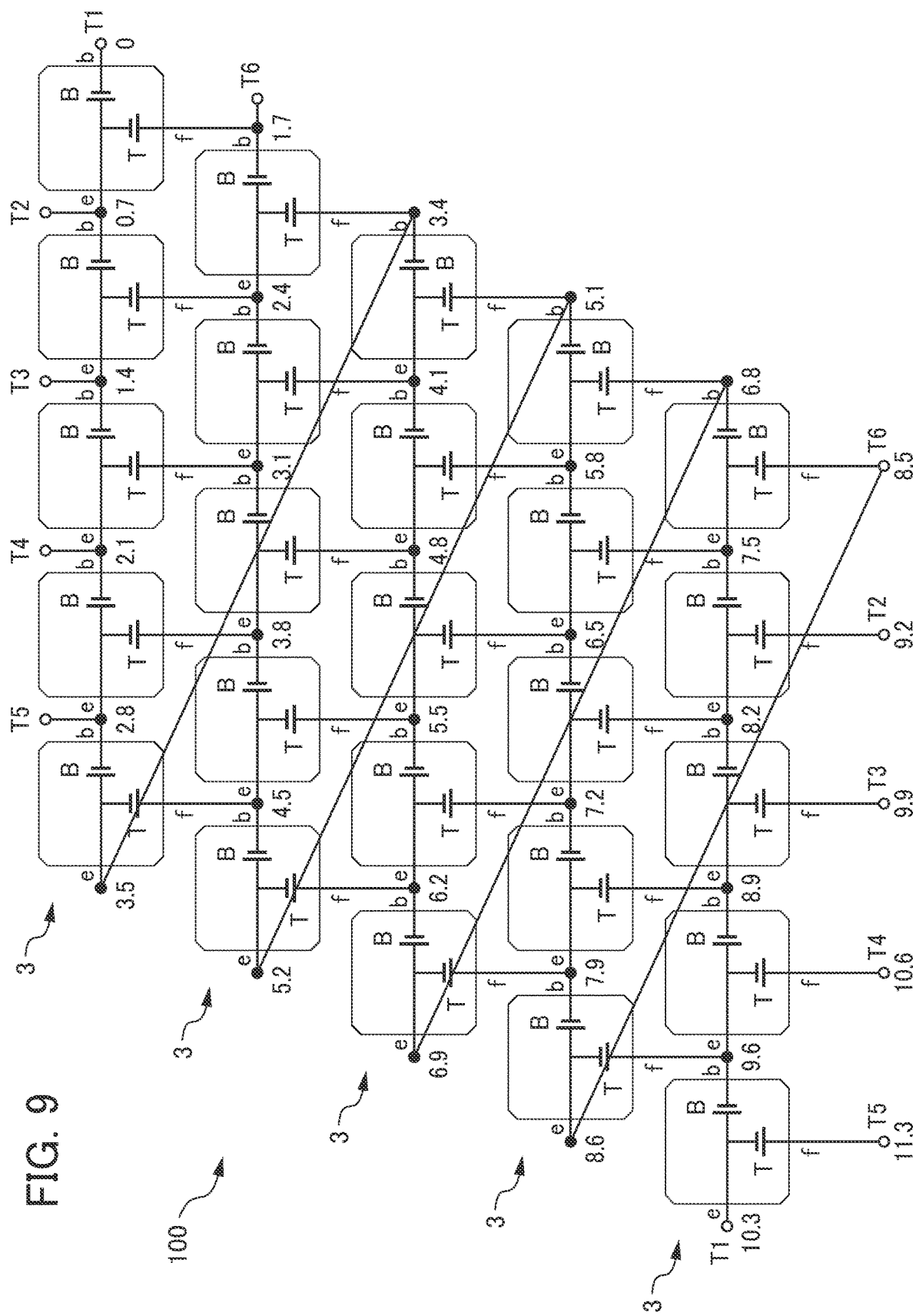
FIG. 9 is an equivalent circuit diagram schematically showing a solar cell module including solar cells according to a modification of the embodiment.

Next, a solar cell module according to Modification 2 of the embodiment will be described with the aid of the simplified equivalent circuit of the solar cell 1 shown in FIG. 4B. FIG. 9 is an equivalent circuit diagram showing a solar cell module including solar cells according to Modification 2 of the embodiment. The solar cell module 100 shown in FIG. 9 includes five cell groups 3 each including five pn-pn junction-type solar cells 1 (M=5, N=5). The solar cell module 100 has six pairs of module terminals T1, T2, T3, T4, T5, and T6 as current extraction electrodes (which corresponds to (N−1+VCM13/(V12+V13) pairs when expressed using VCM13 and (V12+V13) described later). In FIG. 9, the numerical values indicate potentials with respect to the reference potential (0 V).

The solar cell 1 is a three-terminal tandem solar cell including the first photoelectric converter (bottom cell) B and the second photoelectric converter (top cell) T and having the base terminal (first cell terminal) b and the emitter terminal (second cell terminal) e, which are for the first photoelectric converter B, and the emitter terminal (second cell terminal) e and the front terminal (third cell terminal) f, which are for the second photoelectric converter 20.

The five first photoelectric converters B in each cell group 3 are connected in series. The base terminal b at one end (right end) of the first photoelectric converters B connected in series in the first (uppermost) cell group 3 is connected to one of the pair of module terminals T1 and is at a reference potential (0 V).

The emitter terminal e at the other end (left end) of the first photoelectric converters B connected in series in the m-th cell group 3, wherein m is any integer of 1 to 5 (specifically, m is an integer of 1 to M−VCM13/(V12+V13) when expressed using VCM13 and (V12+V13) described later), is connected to the base terminal b at one end of the first photoelectric converters B connected in series in the cell group 3 other than the m-th cell group 3. When m is larger than 3 (namely larger than M−VCM13/(V12+V13)), there is no other cell group 3 to be connected to the m-th cell group 3. In this case, the emitter terminal e at the other end of the first photoelectric converters B connected in series in the m-th cell group 3 is not connected to another cell group 3 but connected to one of the module terminals T1, T2, T3, T4, T5, and T6.

Specifically, the emitter terminal e at the other end in the first cell group 3 is connected to the base terminal b at one end in the third cell group 3, and the emitter terminal e at the other end in the third cell group 3 is connected to the base terminal b at one end in the fifth cell group 3. The emitter terminal e at the other end in the fifth cell group 3 is connected to the other of the pair of module terminals T1.

The base terminal b at one end in the second cell group 3 is connected to one of the pair of module terminals T6, and the emitter terminal e at the other end in the second cell group 3 is connected to the base terminal b at one end in the fourth cell group 3. The emitter terminal e at the other end in the fourth cell group 3 is connected to the other of the pair of module terminals T6.

The five front terminals f in the m-th cell group 3 are respectively connected to the five base terminals b in the m+1-th cell group 3. When m is 5 (M), there is no m+1-th cell group 3 to be connected to the m-th cell group 3. In this case, the five front terminals f in the m-th cell group 3 are not connected to another cell group but connected to any of the module terminals T1, T2, T3, T4, T5, and T6.

Specifically, the five base terminals b in the first cell group 3 are respectively connected to one of the pair of module terminals T1, one of the pair of module terminals T2, one of the pair of module terminals T3, one of the pair of module terminals T4, one of the pair of module terminals T5, and one of the pair of module terminals T6. The five front terminals f in the first cell group 3 are respectively connected to the five base terminals b in the second cell group 3, and the five front terminals f in the second cell group 3 are respectively connected to the five base terminals b in the third cell group 3. The five front terminals f in the third cell group 3 are respectively connected to the five base terminals b in the fourth cell group 3, and the five front terminals f in the fourth cell group 3 are respectively connected to the five base terminals b in the fifth cell group 3. The five front terminals f in the fifth cell group 3 are respectively connected to the other of the pair of module terminals T6, the other of the pair of module terminals T2, the other of the pair of module terminals T3, the other of the pair of module terminals T4, and the other of the pair of module terminals T5.

The potential difference (absolute value) between the emitter terminal e at the other end in the m-th cell group 3 and the base terminal b at one end in the cell group 3 other than the m-th cell group 3, there terminals being connected to each other, is equal to or less than 10% of the potential difference (absolute value) between the emitter terminal e at the other end in the m-th cell group 3 and the base terminal b at one end in the m-th cell group 3 (namely, the potential difference between the two ends of the cell group 3 including the N first photoelectric converters B connected in series) when the emitter terminal e at the other end in the m-th cell group 3 and the base terminal b at one end in the cell group 3 other than the m-th cell group 3 remain not connected to each other. In this way, there may be some potential difference between the terminals to be connected to each other.

Specifically, the difference (absolute value) between the potential 3.5 V at the emitter terminal e at the other end in the first cell group 3 and the potential 3.4 V at the base terminal b at one end in the third cell group 3 is equal to or less than 10% of the difference (absolute value) 3.5 V between the potential 3.5 V at the emitter terminal e at the other end in the first cell group 3 and the potential 0 V (reference potential) at the base terminal b at one end in the first cell group 3. The difference (absolute value) between the potential 6.9 V at the emitter terminal e at the other end in the third cell group 3 and the potential 6.8 V at the base terminal b at one end in the fifth cell group 3 is equal to or less than 10% of the difference 3.5 V (absolute value) between the potential 6.9 V at the emitter terminal e at the other end in the third cell group 3 and the potential 3.4 V at the base terminal b at one end in the third cell group 3.

The difference (absolute value) between the potential 5.2 V at the emitter terminal e at the other end in the second cell group 3 and the potential 5.1 V at the base terminal b at one end in the fourth cell group 3 is equal to or less than 10% of the difference (absolute value) 3.5 V between the potential 5.2 V at the emitter terminal e at the other end in the second cell group 3 and the potential 1.7 V at the base terminal b at one end in the second cell group 3. The different (absolute value) between the potential 8.6 V at the emitter terminal e at the other end in the fourth cell group 3 and the potential 8.5 V at the other of the pair of module terminals T6 is equal to or less than 10% of the difference (absolute value) 3.5 V between the potential 8.6 V at the emitter terminal e at the other end in the fourth cell group 3 and the potential 5.1 V at the base terminal b at one end in the fourth cell group 3.

There is a difference between the current densities of the first and second photoelectric converters B and T. There is also a difference between the voltage of the first photoelectric converter B, namely, the potential difference V12 (=0.7 V) between the base terminal b and the emitter terminal e, and the voltage of the second photoelectric converter T, namely, the potential difference V13 (=1.0 V) between the emitter terminal e and the front terminal f.

When a multiple of the potential difference V12 (=0.7 V) between the base terminal b and the emitter terminal e is represented by VCM12 (=3.5 V) and a multiple of the potential difference (V12+V13) (=1.7 V) between the base terminal b and the front terminal f is represented by VCM13 (=3.4 V), the number of the first photoelectric converters B connected in series in the cell group 3 is VCM12/V12 (=5). The emitter terminal e at the other end in the m-th cell group 3 is connected to the base terminal b at one end in the VCM13/(V12+V13)-th (=2-th) cell group from the m-th cell group 3, namely, in the m+VCM13/(V12+V13)-th (=m+2-th) cell group 3. In this case, as shown above, there may be some potential difference between the terminals to be connected to each other. Thus, the absolute value of the difference between VCM12 and VCM13 only has to be equal to or less than 10% of the absolute value of VCM12.

In other words, when the least common multiple between the potential difference V12 (=0.7 V) between the base terminal b and the emitter terminal e and the potential difference (V12+V13) (=1.7 V) between the base terminal b and the front terminal f is represented by VMC (=3.4 V to 3.5 V), the number of the first photoelectric converters B connected in series in the cell group 3 is VCM/V12 (=about 5). Moreover, the emitter terminal e at the other end in the m-th cell group 3 is connected to the base terminal b at one end in the VCM/(V12+V13)-th (=about 2-th) group from the m-th cell group 3, namely, in the m+VCM/(V12+V13)-th (=about m+2-th) cell group 3. It should be noted that the potential difference VCM is not limited to the least common multiple between the potential difference V12 and the potential difference (V12+V13) and may be any other common multiple. In this regard, as shown above, there may be some potential difference between the terminals to be connected to each other. Thus, the common multiple between the potential difference V12 and the potential difference (V12+V13) may be a multiple of the potential difference (V12+V13) or a multiple of the potential difference V12 when the multiple of the potential difference (V12+V13) falls within the range of the multiple of the potential difference V12±5%. In this embodiment, therefore, the least common multiple between the potential differences V12 (=0.7 V) and (V12+V13) (=1.7 V) may be used as VCM (=3.4 V to 3.5 V).

The solar cell module 100 according to Modification 2 also has the same advantages as those of the solar cell module 100 shown in FIG. 7 described above.

In Modification 2, the solar cell module may have any configuration in which the number of cells in the right-left direction is not limited to N and may be any number and the number of cells in the up-down direction is not limited to M and may be any number.

While Modification 2 shows a solar cell module 100 including M cell groups 3 each including N pn-pn junction-type solar cells 1 (see FIG. 4B), another solar cell module including M cell groups each including N np-np junction-type solar cells (see FIG. 3B) may also be provided similar to Modification 2. Similar to Modification 2, such a solar cell module may have any layout in which the number of cells in the right-left direction is not limited to N and may be any number and the number of cells in the up-down direction is not limited to M and may be any number.

While embodiments of the present disclosure have been described, it will be understood that the embodiments are not intended to limit the present disclosure and may be altered or modified in various ways. For example, the embodiment and Modification 1 thereof show, by way of example, solar cell modules including five cell groups each including three solar cells, and Modification 2 shows a solar cell module including five cell groups each including five solar cells. It will be understood that such embodiments are not intended to limit the present disclosure and the present disclosure may be applied to solar cell modules including M cell groups (M is an integer of 2 or more) each including N solar cells (N is an integer of 3 or more).

The embodiments and the modifications show, by way of example, a solar cell module including tandem solar cells each including: a hetero-junction photoelectric converter, namely, a first photoelectric converter including a crystalline silicon photoelectric converter; and a second photoelectric converter including a perovskite photoelectric converter. It will be understood that such embodiments are not intended to limit the present disclosure and the present disclosure may be applied to any solar cell module including any tandem solar cells each including: a first photoelectric converter including any of various types of photoelectric converters; and a second photoelectric converter including any of various types of photoelectric converters.

What is claimed is:
1. A solar cell module comprising M cell groups each comprising N solar cells, with M being an integer of 3 or more, and N being an integer of 3 or more,
  each of the solar cells being a three-terminal tandem solar cell comprising: a first photoelectric converter; a second photoelectric converter; first and second cell terminals for the first photoelectric converter; and the first cell terminal and a third cell terminal for the second photoelectric converter,
  the N first photoelectric converters being connected in series in the cell group, wherein when the first cell terminal at one end of the first photoelectric converters connected in series in a first one of the cell groups is at a reference potential, the second cell terminal at another end of the first photoelectric converters connected in series in an m-th one of the cell groups is connected to the first cell terminal at one end of the first photoelectric converters connected in series in another m+2-th or later one of the cell groups, with m being an integer from 1 to M, the N third cell terminals in the m-th cell group are respectively connected to the N first cell terminals in an m+1-th one of the cell groups, and an absolute value of a potential difference between the second cell terminal at the another end in the m-th cell group and the first cell terminal at the one end in the another cell group, the cell terminals being connected to each other, is equal to or less than 10% of an absolute value of a potential difference between the first cell terminal at the one end in the m-th cell group and the second cell terminal at the another end in the m-th cell group when the second cell terminal at the another end in the m-th cell group and the first cell terminal at the one end in the another cell group remain not connected to each other.

2. The solar cell module according to claim 1, wherein a potential difference V12 between the first and second cell terminals for the first photoelectric converter is different from a potential difference V13 between the first and third cell terminals for the second photoelectric converter.

3. The solar cell module according to claim 2, wherein when VCM12 is a multiple of the potential difference V12, and VCM13 is a multiple of the potential difference V13, N corresponds to VCM12/V12, the another cell group connected to the m-th cell group corresponds to a VCM13/V13-th cell group from the m-th cell group, and an absolute value of a difference between the VCM12 and the VCM13 is equal to or less than 10% of an absolute value of the VCM12.

4. The solar cell module according to claim 3, wherein m is an integer of 1 to M-VCM13/V13, the second cell terminal at the another end of the first photoelectric converters connected in series in the m-th cell group, wherein m is larger than M-VCM13/V13, is not connected to the another cell group, and the N third cell terminals in the m-th cell group, wherein m is equal to M, are not connected to the another cell group.

5. The solar cell module according to claim 1, wherein the first photoelectric converter has a current density different from that of the second photoelectric converter.

6. The solar cell module according to claim 1, wherein the first photoelectric converter is a back contact-type crystalline silicon photoelectric converter, and the second photoelectric converter is a perovskite photoelectric converter.

7. The solar cell module according to claim 1, further comprising:

at least three pairs of module terminals as current extraction electrodes.

8. The solar cell module according to claim 2, wherein the first photoelectric converter has a current density different from that of the second photoelectric converter.

9. The solar cell module according to claim 2, wherein the first photoelectric converter is a back contact-type crystalline silicon photoelectric converter, and the second photoelectric converter is a perovskite photoelectric converter.

10. The solar cell module according to claim 2, further comprising:

at least three pairs of module terminals as current extraction electrodes.

* * * * *